United States Patent
Schuegraf et al.

(10) Patent No.: US 12,170,248 B2
(45) Date of Patent: Dec. 17, 2024

(54) GRAPHENE BEOL INTEGRATION INTERCONNECTION STRUCTURES

(71) Applicant: Destination 2D Inc., Milpitas, CA (US)

(72) Inventors: Klaus Schuegraf, San Diego, CA (US); Kaustav Banerjee, Goleta, CA (US); Brian Cronquist, Klamath Falls, OR (US)

(73) Assignee: DESTINATION 2D, Milpitas, CA (US)

( * ) Notice: Subject to any disclaimer, the term of this patent is extended or adjusted under 35 U.S.C. 154(b) by 0 days.

(21) Appl. No.: 18/607,380

(22) Filed: Mar. 15, 2024

(65) Prior Publication Data

US 2024/0339407 A1    Oct. 10, 2024

Related U.S. Application Data

(60) Provisional application No. 63/457,362, filed on Apr. 5, 2023.

(51) Int. Cl.
 *H01L 23/532* (2006.01)
 *H01L 23/522* (2006.01)
 *H01L 23/528* (2006.01)

(52) U.S. Cl.
 CPC .... *H01L 23/53276* (2013.01); *H01L 23/5226* (2013.01); *H01L 23/5283* (2013.01)

(58) Field of Classification Search
 CPC ........... H01L 23/53276; H01L 23/5226; H01L 23/5283

USPC .......................................................... 257/734
See application file for complete search history.

(56) References Cited

U.S. PATENT DOCUMENTS

| 2015/0137377 A1* | 5/2015 | Bao .................. H01L 21/76849 257/758 |
| 2022/0359413 A1* | 11/2022 | Yang ................. H01L 23/53295 |

\* cited by examiner

*Primary Examiner* — Tu-Tu V Ho
(74) *Attorney, Agent, or Firm* — Womble Bond Dickinson (US) LLP; Joseph Bach, Esq.

(57) ABSTRACT

An interconnection structure, including: a first BEOL (Back-End-Of-Line) level which includes a first MLG (Multi-Layer Graphene) layer which includes at least one first line structure of MLG material; and a first isolation layer which includes an electrically isolating material and is disposed above and beside the at least one first line structure of MLG material; a second BEOL level which includes a second MLG layer (includes MLG material) disposed above the first isolation layer; a connection path electrically connecting first MLG layer to second MLG layer; and at least one via with serrated edges mitigating misalignment impacts and providing low via to line contact resistance, where the connection path includes one of the at least one via, where a width of the at least one first line structure of MLG material is greater than a diameter of the one of the at least one via, and where both MLG layers are intercalation doped.

20 Claims, 6 Drawing Sheets

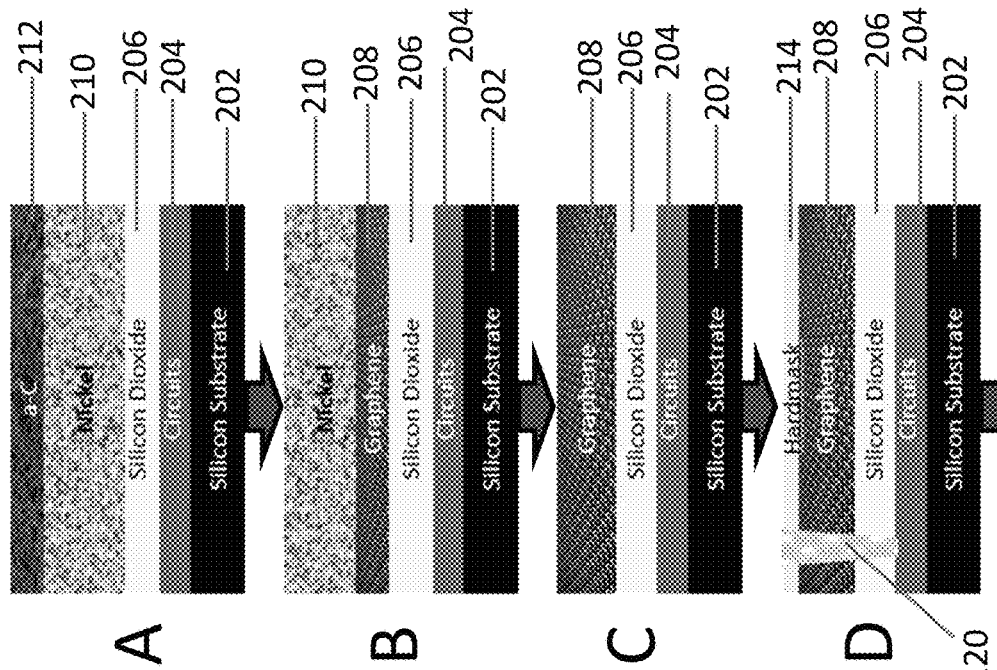
Fig. 2A 270
Fig. 2B 271
Fig. 2C 272
Fig. 2D 273
To top of column
Next page – Fig. 2E
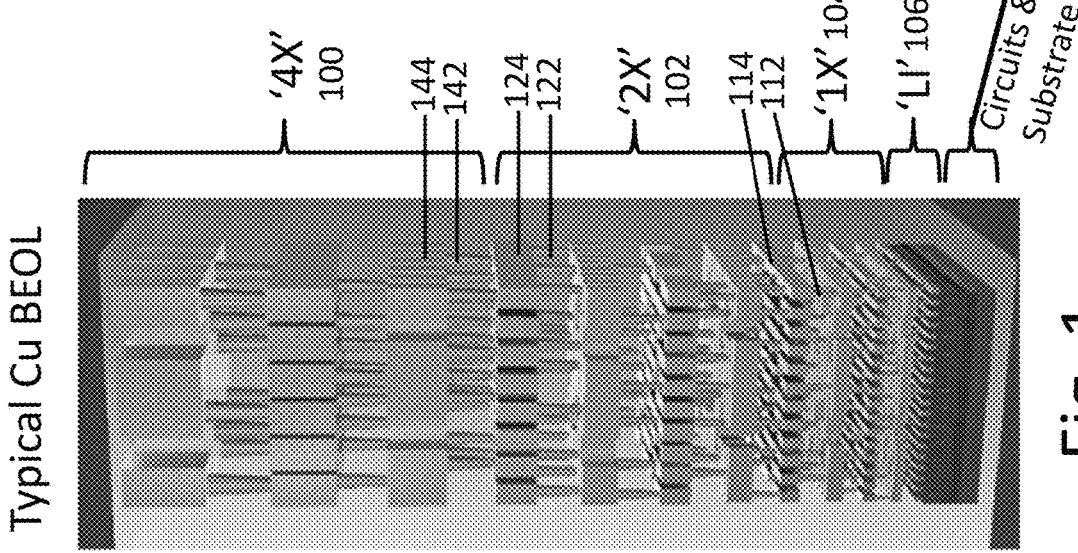
Fig. 1

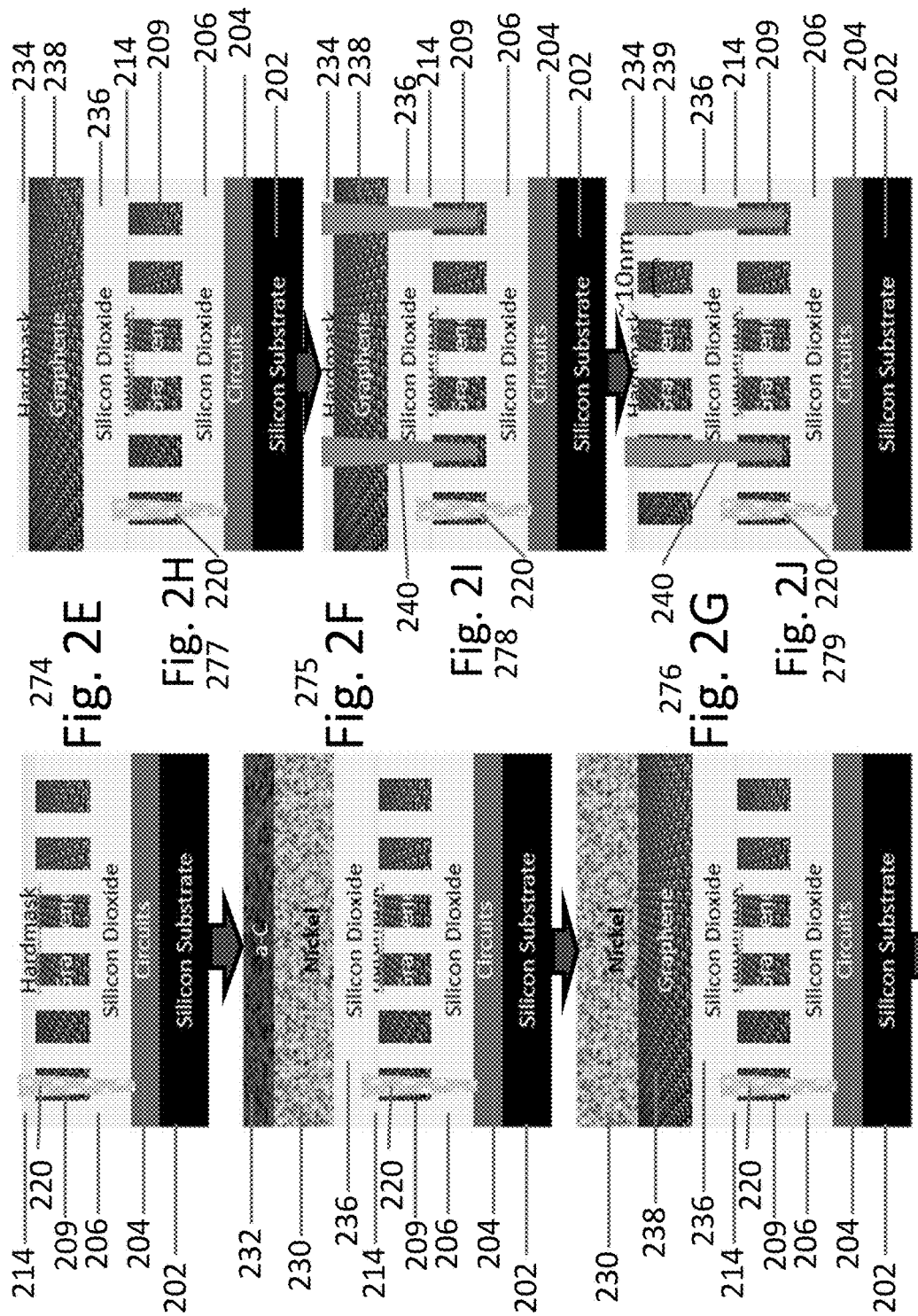

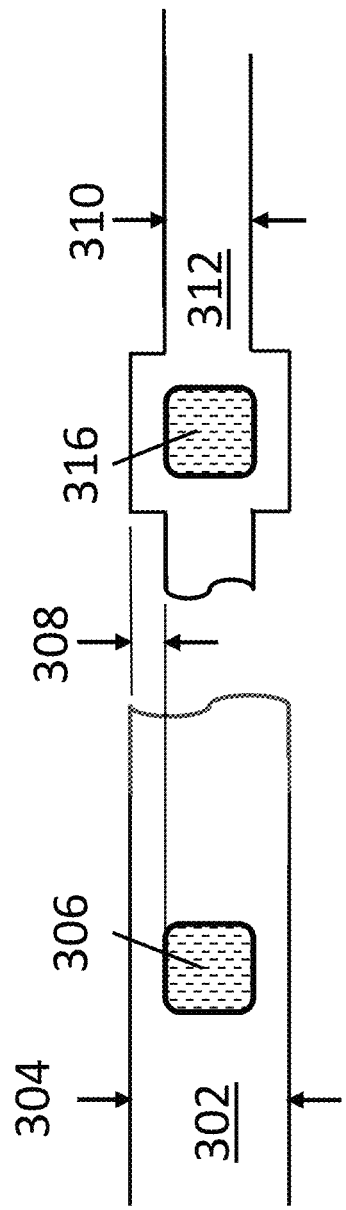

GRAPHENE BEOL INTEGRATION INTERCONNECTION STRUCTURES

CROSS-REFERENCE OF RELATED APPLICATIONS

This application claims the benefit of U.S. Provisional Patent Application No. 63/457,362 filed on 5 Apr. 2023; the entire contents of the foregoing applications are incorporated herein by reference.

U.S. patent application Ser. No. 18/527,043, filed on 1 Dec. 2023, LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE; U.S. patent application Ser. No. 17/863,232, filed on 12 Jul. 2022, and titled LOW-TEMPERATURE/BEOL-COMPATIBLE HIGHLY SCALABLE GRAPHENE SYNTHESIS TOOL; U.S. patent application Ser. No. 17/857,954, filed on 5 Jul. 2022, and titled LOW-TEMPERATURE/BEOL-COMPATIBLE HIGHLY SCALABLE GRAPHENE SYNTHESIS TOOL; U.S. Provisional Patent Application No. 63/218,498, filed on 6 Jul. 2021, and titled WAFER-SCALE CMOS-COMPATIBLE GRAPHENE SYNTHESIS TOOL; and U.S. Provisional Patent Application No. 63/441,766, filed on 27 Jan. 2023, titled LARGE-AREA/WAFER-SCALE CMOS-COMPATIBLE 2D-MATERIAL DOPING TOOLS, PROCESSES, AND METHODS, INCLUDING DOPING OF SYNTHESIZED GRAPHENE are related applications; the entire contents of the foregoing applications are incorporated herein by reference.

BACKGROUND

Solid-phase diffusion of atoms in a "material stack" forming a "diffusion-couple" can be leveraged to synthesize high-quality thin-films at relatively low temperatures, needed in a wide range of applications covering microelectronics, optoelectronics, bioelectronics, quantum computing, and many more. However, enabling such solid-phase diffusion assisted thin-film growth; particularly over large "wafer-scale" (e.g., 200 mm, 300 mm, etc.) substrates, and within reasonable growth times, require design and fabrication of novel apparatus that can allow uniform application of a wide range of temperatures and pressures over the entire surface area of the semiconductor wafer or any other substrate forming the diffusion-couple. A core component of such an apparatus is a reactor that is not only capable of hosting such large area substrates but also allow a chemically purged environment, heated large-area substrates with near-zero temperature non-uniformity, as well as facile mechanisms to apply relatively large and uniform mechanical pressures (e.g., up to 1000 psi, etc.) to the diffusion-couple. It is noted that in some examples, atmospheric pressure can be utilized. The above references cited in paragraph herein describe the invention embodiments for such an apparatus. As well, paragraph herein references Ser. No. 18/527,043 and 63/441,766 describe doping apparatus which can be compatible with the intercalation doping generally required for most 2D materials.

An imminent need for such a large-area diffusion-couple is in the emerging field of atomically-thin two-dimensional (2D) materials, particularly graphene or multi-layered-graphene (MLG) (essentially a single or multiple atomic layers of carbon atoms arranged in a hexagonal lattice), that must be directly synthesized over a desired substrate (typically a dielectric or a metal) without the need for a transfer-step that is considered unfeasible and cost-ineffective in the mainstream electronics (or CMOS) industry. Such graphene/MLG layers are preferred materials in several back-end-of-line or BEOL (refers to process steps in chip manufacturing after the formation of the active devices such as transistors and diodes) applications, particularly on-chip interconnects. However, BEOL interconnects must be synthesized under a strict thermal budget of about less than 400° C. to avoid any damage to the underlying active & passive devices (e.g., transistors, diodes, etc. via increased diffusion of impurities).

The above references cited in paragraph herein describe the invention embodiments for such an apparatus. As well, paragraph herein reference 63/441,766 describes doping apparatus which can be compatible with the intercalation doping generally required for most 2D materials and referenced herein for the exemplary MLG.

However, there are challenges in effectively contacting electrically the graphene/MLG layer with a low resistance, especially one useful for commercial circuits, as well as other integration challenges with modern processes, for example, 15 nm and below process nodes. This disclosure teaches and describes inventive embodiments to solve these integration challenges.

SUMMARY OF THE INVENTION

In one aspect, an integration BEOL process flow which includes low temperature on wafer/substrate MLG synthesis, doping thereof, and the formation of, for example, serrated contacts for maximal sidewall contact area for the contact to MLG and via to MGL interconnect lines/structures.

BRIEF DESCRIPTION OF THE DRAWINGS

The present application can be best understood by reference to the following description taken in conjunction with the accompanying figures, in which like parts may be referred to by like numerals.

FIG. 1 illustrates an example 3D rendering of a typical Copper (Cu) Back-End-Of-Line (BEOL) of a semiconductor device/integrated circuit;

FIG. 2A illustrates an example cross-sectional drawing of a first exemplary intermediate structure which is part of an exemplary BEOL process flow, according to some embodiments;

FIG. 2B illustrates an example cross-sectional drawing of a second exemplary intermediate structure which is part of an exemplary BEOL process flow, according to some embodiments;

FIG. 2C illustrates an example cross-sectional drawing of a third exemplary intermediate structure which is part of an exemplary BEOL process flow, according to some embodiments;

FIG. 2D illustrates an example cross-sectional drawing of a fourth exemplary intermediate structure which is part of an exemplary BEOL process flow, according to some embodiments;

FIG. 2E illustrates an example cross-sectional drawing of a fifth exemplary intermediate structure which is part of an exemplary BEOL process flow, according to some embodiments;

FIG. 2F illustrates an example cross-sectional drawing of a sixth exemplary intermediate structure which is part of an exemplary BEOL process flow, according to some embodiments;

FIG. 2G illustrates an example cross-sectional drawing of a seventh exemplary intermediate structure which is part of an exemplary BEOL process flow, according to some embodiments;

FIG. 2H illustrates an example cross-sectional drawing of an eighth exemplary intermediate structure which is part of an exemplary BEOL process flow, according to some embodiments;

FIG. 2I illustrates an example cross-sectional drawing of a ninth exemplary intermediate structure which is part of an exemplary BEOL process flow, according to some embodiments;

FIG. 2J illustrates an example cross-sectional drawing of a tenth exemplary intermediate structure which is part of an exemplary BEOL process flow, according to some embodiments;

FIG. 3A illustrates an example top-view drawing describing a layout/design structure which will provide maximal edge connection between an edge of an MLG line/structure and a contact or a via, according to some embodiments;

FIG. 3B illustrates an example top-view drawing describing an additional layout/design structure which will provide maximal edge connection between an edge of an MLG line/structure and a contact or a via, according to some embodiments;

Figures 4A, 4B, 4C:
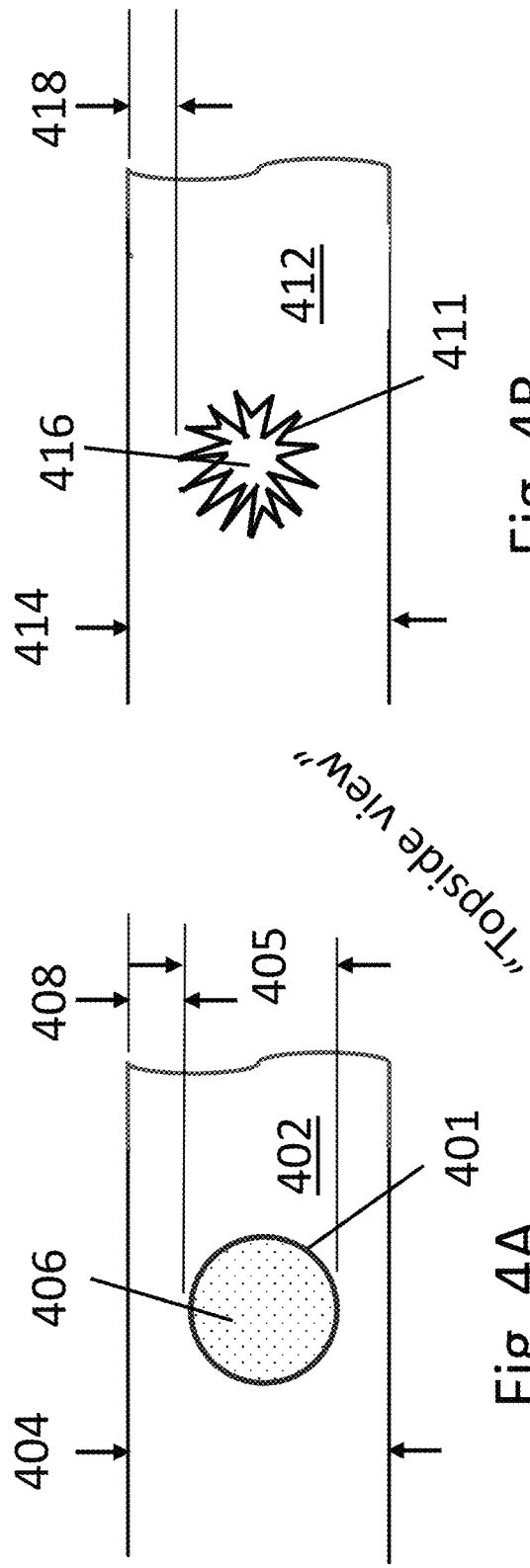
FIG. 4A illustrates an example conventional/normal shaped via or contact.
FIG. 4B illustrates an example via/contact which has an increased topside perimeter and thus an increased interconnect line to contact/via sidewall contact area.
FIG. 4C illustrates an additional example via/contact which has an increased topside perimeter and thus an increased interconnect line to contact/via sidewall contact area.

The Figures described above are a representative set and are not exhaustive with respect to embodying the invention.

DESCRIPTION

Disclosed are systems, methods, micro-/nano-structures, and articles of manufacture for graphene-based BEOL integration techniques. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of processing, integration techniques, design and layout techniques, material alternatives for various sub-steps or sub-structures, programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein (if any) are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Back-End-Of-Line (BEOL) is the second portion of IC fabrication where the interconnects (e.g., the metallization layers) separated by intra-layer or inter-layer insulators and other elements are formed between and over the individual devices (primarily the transistors) on the wafer/substrate.

Complementary metal-oxide-semiconductor (CMOS) is a type of metal-oxide-semiconductor field-effect transistor (MOSFET) fabrication process that uses complementary and electrically symmetrical pairs of p-type and n-type MOSFETs for implementing logic functions.

Grain boundary (GB) is the interface between two grains and/or crystallites in a polycrystalline material.

Grain size may be the average of the longest axis of each grain of a deposited metal, for example, such as, Ni or Co or W, or may sometimes refer to the longest axis of a single grain.

Graphene is an allotrope of carbon consisting of a single layer of atoms arranged in a two-dimensional honeycomb lattice.

Graphene nanoribbons (GNRs) are strips of graphene with width less than one-hundred (100) nm.

MLG refers to Multi-Layer Graphene, which may include interconnect structures in ultra-low RC delay BEOL schemes, typically including two or more layers of graphene.

Graphite is a layered crystalline form (3D allotrope) of the element carbon with its atoms arranged and covalently bonded forming a hexagonal structure within the layers.

Silicon dioxide is an oxide of silicon and an insulator with the chemical formula $SiO_2$.

Wafer is a thin slice of semiconductor (e.g. a crystalline silicon, germanium, GaAs) used for the fabrication of integrated circuits, etc.

Example Process Flows and Structures for an MLG Based BEOL

It is noted that the following example embodiments discuss a graphene source by way of example. However, other carbon-sources (including any carbon carrying compound) can be utilized in other example embodiments.

FIG. 1 illustrates an example 3D inner view of a typical semiconductor BEOL which may include circuits and substrate 108, located at the traditionally called 'bottom' of the integrated circuit structure, with interconnect 'wiring' placed on top of circuits and substrate 108. The interconnect 'wiring' may include LI layer(s) 106, 1× layer(s) 104, 2× layer(s) 102, and 4× layer(s) 100. Circuits and substrate 108 may be connected to LI layer(s) 106 or 1× layer(s) 104 through contacts (not shown or very small) and/or connected to each other through vias (not shown or very small). The dimensions of this interconnect pair of contacts/vias and metal lines (LI layer(s) 106 and/or 1× layer(s) 104) generally may be at the minimum line resolution of the lithography and etch capability for that technology process node. Traditionally, this is called a '1×' design rule metal layer. Usually, the next metal layers 1× metal 114 paired with 1× vias 112 may be also at the "1×" design rule, where desired according to engineering and design considerations and tradeoffs. Then the next few metal layers 2× metal layer(s) 124 (paired with 2× vias 122) often may be constructed at twice the minimum lithographic and etch capability and traditionally called '2×' layers (2× layer(s) 102), and may have thicker metal (generally about 2 times thicker) than 1× layer(s) 104 for a higher current carrying capability. Accordingly, the 4× metal 144 & 4× via 142 pairs represent the '4×' 100 metallization layers where the planar and thickness dimensions may be again larger and thicker than the 2× layer(s) 102 and 1× layer(s) 104 layers, generally by a factor of about 2 and about 4 respectively.

LI layer(s) 106 (Local Interconnect) is sometimes utilized at minimum and sometimes sub-minimum lithographic dimensioned layers, mostly utilized to make memory within cell and/or cell to cell connections/cross-overs and may be constructed out of materials other than Cu, for example W, Co, and so forth, and generally have short path lengths.

The precise number of 1× or 2× or 4× layers may vary depending on interconnection needs and other requirements; however, the general flow may be that of increasingly larger metal line, metal space, and via dimensions (increasing metal/interconnect pitch and metal/interconnect thickness) as the metal layers are farther from the silicon transistors and closer to the bond pads. In a monolithic 3D structure and device, this is generally not true. Generally, between transistor layers or levels the metallization order might be 1×, 2×, 4×, 2×, 1× as tight geometry interconnect is required on the backside connects of the 'top' layer/level pair as well as the traditional topside contacts of the 'bottom' transistor layer/level.

As scaling has proceeded and attempts to satisfy the economic relationship elucidated in Moore's Law, the line, space, and via diameter (& overlap) have had to scale. This has been difficult to maintain the scaling to follow Dennard's rules for many reasons, but a major one is that the cross-section of the metal lines, whether 1×, 2× or 4×, have had to be increasingly filled with high resistivity materials, primarily and naturally the barrier metals. Barrier metals, to hold in the transistor destructive Cu atoms, can't scale, they are physical based barriers. And less and less of the metal interconnect cross section comprises the low resistivity Cu. However, nearly forgotten by many is the other part of the interconnect performance equation of RC, the capacitance (C) of the interconnect lines. In a desire to keep the R as low as possible the heights (thicknesses) have not scaled very well. Thus, the C has now become a challenge to overcome.

Graphene, specifically MLG (Multi-Layer Graphene), is currently considered the next interconnect material for the semiconductor industry. The critical arrangement of carbon atoms provides not just a low R, especially when doped, but also the same current carrying capacity can be reliably run through the MLG with a substantially thinner 'wire'. Thus, the C of the RC is significantly reduced for MLG interconnects over traditional Cu interconnects. However, until recent innovations, the graphene or MLG had to be formed on a specially treated substrate, at generally greater than BEOL compatible temperatures such as 600-900° C., thus making for a very defective and expensive process. Recently, an MLG direct synthesis method has been invented and can produce with high quality an MLG at BEOL compatible temperatures, i.e., less than 400° C., on the desired circuit wafer. See at least patent applications 63/123,587 and PCT/US21/61361 and at least papers J. Jiang, et al., "Intercalation doped multilayer-graphene-nanoribbons for next generation interconnect," *Nano Letters,* 17 (3), pp. 1482-1488, 2017; and J. Jiang, et al., "All-carbon interconnect scheme integrating graphene wires and carbon-nanotube-vias," *IEEE IEDM*, pp. 14.3.1-14.3.4, 2017; and J. Jiang, et al., "CMOS-Compatible Doped-Multilayer-Graphene Interconnects for Next-Generation VLSI," *IEEE IEDM*, pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices*, vol. 68, No. 4, April 2021, pp. 2063-2091; the entire contents of the forgoing are incorporated by reference.

This new methodology, however, has some integration challenges to create the least expensive, lowest number of steps, and quality preserving (of MLG, low-k dielectrics, via EM, etc.) process flow(s). This is the primary thrust of the novel and non-obvious inventive embodiments contained herein at least FIGS. 2 and 3.

As illustrated in FIG. 2A, an intermediate structure 270 is an example cross-sectional drawing of a typical intermediate structure which is near the beginning of the BEOL of the process flow, plus structure 270 has had two additional layers deposited on top. Structure 270 may include silicon substrate 202, circuits layer 204, isolation layer 206, sacrificial nickel layer 210, and amorphous carbon layer 212. Silicon substrate 202 may include a single crystal substrate and may at times be called a 'substrate'. Silicon substrate 202 may not be restricted to the monocrystalline form of the silicon element, and thus may include glass, quartz, Ga, GaAs, GaN, SiGe, and so on. Circuits layer 204 may include transistors, capacitors, resistors, and the like, laid out so that when connected, generally by using metal layers above and perhaps below, would form the desired electrical and/or optical sub-circuits and circuits.

Isolation layer 206 typically includes $SiO_2$, which may be doped with Phosphorous and/or Boron, and is generally called the ILD (Intra-Layer Dielectric). Sometimes, other oxides and forms of oxide may be used, for example, doped or undoped SOG (Spin-On-Glass) with a thermal anneal. Its main purpose is to electrically isolate the first metal layer (or Local Interconnect) from electrically coupling with any device on the substrate, unless desired. Generally, a vertical electrical isolation between the BEOL conductive layers. Desirable connections may be made by selectively removing ILD material in small topside view areas, typically called 'contacts', and replacing that volume with electrically conductive material.

Sacrificial nickel layer 210 may be deposited on top of isolation layer 206. This layer has the function of diffusing the carbon atoms into an even spread of carbon source by the time they reach the Ni/oxide interface, in order to form high quality sp2-bonded MLG. Sacrificial nickel layer 210 may be thermally annealed to obtain the desired grain size and edge fraction.

Amorphous carbon layer 212 may be deposited on top of the sacrificial nickel layer 210. The amorphous carbon layer 212 to sacrificial nickel layer 210 interface and the sacrificial nickel layer 210 to isolation layer 206 interface can be crucial to the formation of the desired quality of MLG formed at the sacrificial nickel layer 210—isolation layer 206 interface. The typical thickness of sacrificial nickel layer 210 may be about 100 nm, or about 80 nm, or about 50 nm, or about 130 nm, or about 150 nm or about 200 nm, depending on engineering and materials considerations; and the typical thickness of amorphous carbon layer 212 may be, for example, about 10 nm, or about 15 nm, or about 20 nm, or about 25 nm, or about 30 nm, depending on engineering and materials considerations. However, both previous thicknesses may be adjusted to obtain the desired number of graphene layers within MLG layer 208 and are subject to engineering, chemistry, and material science considerations.

As illustrated in FIG. 2B, second intermediate structure 271 is an example cross-sectional drawing of first intermediate structure 270 where the structure has been processed to form MLG layer 208. Second intermediate structure 271 may include silicon substrate 202, circuits layer 204, isolation layer 206, MLG layer 208, and sacrificial nickel layer 210. Silicon substrate 202, circuits layer 204, and isolation layer 206 are relatively unchanged through this processing. Amorphous carbon layer 212 may be exposed to pressure and temperature acceleration to diffuse through nickel layer 210 and form MLG layer 208. Details may be found in at least U.S. Provisional Patent Application No. 63/123,587, filed on 10 Dec. 2020; and International PCT PCT/US21/61361 filed on 1 Dec. 2021. As well, see at least patent applications 63/123,587 and PCT/US21/61361 and at least papers J. Jiang, et al., "Intercalation doped multilayer-graphene-nanoribbons for next generation interconnect," *Nano Letters,* 17 (3), pp. 1482-1488, 2017; and J. Jiang, et al., "All-carbon interconnect scheme integrating graphene wires and carbon-nanotube-vias," *IEEE IEDM,* pp. 14.3.1-14.3.4, 2017; and J. Jiang, et al., "CMOS-Compatible Doped-Multilayer-Graphene Interconnects for Next-Generation VLSI," *IEEE IEDM,* pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices,* vol. 68, No. 4, April 2021, pp. 2063-2091; the entirety of all of the forgoing are incorporated by reference. Although FIG. 2B does not show an amorphous carbon layer 212, due to various processing non-uniformities and indeed engineering considerations, there may be carbon residues (not shown) after the MLG formation processing. These carbon residues may be located on top of sacrificial nickel layer 210.

As illustrated in FIG. 2C, third intermediate structure 272 is an example cross-sectional drawing of second intermediate structure 271 where the structure has been processed to remove any carbon residues (if any) from previously existing amorphous carbon layer 212 and the removal of sacrificial nickel layer 210 without damaging the MLG layer 208. Third intermediate structure 272 may include silicon substrate 202, circuits layer 204, isolation layer 206, and MLG layer 208. Silicon substrate 202, circuits layer 204, and isolation layer 206 are relatively unchanged through this processing. Processing temperatures must stay below preferably about 450 deg C. so to not disturb/perturb at least transistor dopant profiles, contact reliability, via reliability, and low-k dielectric stability (if any). Processing details for carbon residue removal and nickel removal without harming the MLG can be found in at least United States Provisional Patent Application No. 63/123,587, filed on 10 Dec. 2020; and International PCT PCT/US21/61361 filed on 1 Dec. 2021. See at least patent applications 63/123,587 and PCT/US21/61361 and at least papers J. Jiang, et al., "Intercalation doped multilayer-graphene-nanoribbons for next generation interconnect," *Nano Letters,* 17 (3), pp. 1482-1488, 2017; and J. Jiang, et al., "All-carbon interconnect scheme integrating graphene wires and carbon-nanotube-vias," *IEEE IEDM,* pp. 14.3.1-14.3.4, 2017; and J. Jiang, et al., "CMOS-Compatible Doped-Multilayer-Graphene Interconnects for Next-Generation VLSI," *IEEE IEDM,* pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices,* vol. 68, No. 4, April 2021, pp. 2063-2091; the entirety of all of the forgoing are incorporated by reference.

As illustrated in FIG. 2D, fourth intermediate structure 273 is an example cross-sectional drawing of third intermediate structure 272 where the structure has been processed to define, etch, and fill contacts 220 optionally but preferred using a hard mask 214. Fourth intermediate structure 273 may include silicon substrate 202, circuits layer 204, isolation layer 206, MLG layer 208, hard mask 214 and contacts 220. Fourth intermediate structure 273 has been processed to form hard mask 214 and then is lithographically processed to form contact openings in a photoresist (not shown), then etched to open the hard mask 214 material in all the desired contact locations. Then the photoresist is stripped and wafer/substrate cleaned, and a deep etch is performed to form the contact 220 where the etch may sequentially, and sometimes selectively, remove portions/regions of the thin MLG layer 208, then portions/regions of isolation layer 206 and open up the top of the desired circuit element (S/D, gate, etc.) of circuits layer 204 to make a non-destructive opening for the contact 220 metallization to connect to. Hard mask 214 material may include for example, material such as SiN, $Si_3N_4$, Si rich oxides, and so on, which would be chosen with due engineering care to be selectively etchable to, at least with respect to MLG layer 208 and isolation layer 206. An initial intercalation doping through the contact 220 holes formed may be performed, depending on engineering considerations. Details of intercalation doping may be found in at least U.S. Provisional Patent Application 63/441,766; and in J. Jiang, et al., "Intercalation doped multilayer-graphenenanoribbons for next generation interconnect," *Nano Letters,* 17 (3), pp. 1482-1488, 2017; and J. Jiang, et al., "CMOS-Compatible Doped-Multilayer-Graphene Interconnects for Next-Generation VLSI," *IEEE IEDM,* pp. 34.5.1-34.5.4, 2018. Contact 220 may be filled with the desired surface cleaning and barrier metals and generally the majority of the contact 220 volume is W metal. The top of contact 220 may be CMP'd and utilize hard mask 214 as a polish stop. MLG layer 208 may then be lithographically defined in photoresist (not shown) and then etched to form multiplicity of MLG lines/structures 209.

An alternative process flow option is to etch the MLG layer 208 to form multiplicity of MLG lines/structures 209 before forming and filling contacts 220. This flow, however, may be lithographically more challenging and be more sensitive to forming metal stringers between MLG lines/structures 209.

As illustrated in FIG. 2E, fifth intermediate structure 274 is an example cross-sectional drawing of fourth intermediate structure 273 where the fourth intermediate structure 273 has been rotated 90 degrees to show a multiplicity of MLG lines/structures 209 where in FIG. 2D only a single MLG layer 208 was shown (for clarity of a 2D drawing). As well, for clarity of the Figures only one contact 220 is shown in the remaining FIGS. 2E to 2J, however, of course many of the contact 220s would exist in a typical device/circuit.

As illustrated in FIG. 2F, sixth intermediate structure 275 is an example cross-sectional drawing of fifth intermediate structure 274 where the structure has been processed to form second isolation layer 236, second sacrificial nickel layer 230 and second amorphous carbon layer 232. Sixth intermediate structure 273 may include silicon substrate 202, circuits layer 204, isolation layer 206, multiplicity of MLG lines/structures 209, contact 220, second isolation layer 236, second sacrificial nickel layer 230 and second amorphous carbon layer 232. Silicon substrate 202, circuits layer 204, and isolation layer 206 are to be relatively unchanged through this processing.

Second isolation layer 236 typically includes a low-k combination of carbon containing oxides and is generally called the IMD (Intra-Metal Dielectric). Sometimes, other oxides and forms of oxide may be used. Its main purpose is to electrically isolate the signals carried in the multiplicity of MLG lines/structures 209 from electrically coupling with signals carried in the soon to be formed multiplicity of second MLG lines/structures 239, unless desired. Desirable connections may be made by selectively removing at least IMD second isolation layer 236 material in small topside view areas, typically called 'vias', and replacing that volume with electrically conductive material.

Second sacrificial nickel layer 230 may be deposited on top of second isolation layer 236. This layer has the function of diffusing the carbon atoms into an even spread of carbon atoms by the time they reach the Ni/oxide interface, in order to form high quality sp2-bonded MLG. Second sacrificial nickel layer 230 may be thermally annealed to obtain the desired grain size and edge fraction.

Second amorphous carbon layer 232 may be deposited on top of the second sacrificial nickel layer 230. The second amorphous carbon layer 232 to second sacrificial nickel layer 230 interface and the second sacrificial nickel layer 230 to IMD second isolation layer 236 interface can be crucial to the formation of the desired quality of MLG formed at the second sacrificial nickel layer 230—second isolation layer 236 interface. The typical thickness of second sacrificial nickel layer 230 may be about 100 nm, or about 80 nm, or about 50 nm, or about 130 nm, or about 150 nm or about 200 nm, depending on engineering and materials considerations; and the typical thickness of amorphous carbon layer 232 may be, for example, about 10 nm, or about 15 nm, or about 20 nm, or about 25 nm, or about 30 nm, depending on engineering and materials considerations. However, both previous thicknesses may be adjusted to obtain the desired number of graphene layers within MLG layer 238 and are subject to engineering, chemistry, and material science considerations.

As illustrated in FIG. 2G, seventh intermediate structure 276 is an example cross-sectional drawing of sixth intermediate structure 275 where the structure has been processed to form second MLG layer 238. Seventh intermediate structure 276 may include silicon substrate 202, circuits layer 204, isolation layer 206, multiplicity of MLG lines/structures 209, contact 220, first hard mask regions 214, second isolation layer 236, second sacrificial nickel layer 230, and second graphene layer 238. Silicon substrate 202, circuits layer 204, and isolation layer 206 are relatively unchanged through this processing due to the low temperature (less than 400, usually less than 350° C.) processing to form the MLG. Second amorphous carbon layer 232 may be exposed to pressure and temperature acceleration to diffuse through second sacrificial nickel layer 230 and form second MLG layer 238. Details may be found in at least U.S. Provisional Patent Application No. 63/123,587, filed on 10 Dec. 2020; and International PCT PCT/US21/61361 filed on 1 Dec. 2021. As well, see at least patent applications 63/123,587 and PCT/US21/61361 and at least papers J. Jiang, et al., "Intercalation doped multilayer-graphene-nanoribbons for next generation interconnect," *Nano Letters,* 17 (3), pp. 1482-1488, 2017; and J. Jiang, et al., "All-carbon interconnect scheme integrating graphene wires and carbon-nanotube-vias," *IEEE IEDM,* pp. 14.3.1-14.3.4, 2017; and J. Jiang, et al., "CMOS-Compatible Doped-Multilayer-Graphene Interconnects for Next-Generation VLSI," *IEEE IEDM,* pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices,* vol. 68, No. 4, April 2021, pp. 2063-2091; the entirety of all of the forgoing are incorporated by reference. Although FIG. 2G does not show a second amorphous carbon layer 232, due to various processing non-uniformities and indeed engineering considerations, there may be carbon residues (not shown) after the MLG formation processing. These carbon residues may be located on top of second sacrificial nickel layer 230.

As illustrated in FIG. 2H, eighth intermediate structure 277 is an example cross-sectional drawing of seventh intermediate structure 276 where the structure has been processed to remove any carbon residues (if any) from previously existing second amorphous carbon layer 232 and the removal of second sacrificial nickel layer 230 without damaging the second MLG layer 238. Eighth intermediate structure 277 may include silicon substrate 202, circuits layer 204, isolation layer 206, multiplicity of MLG lines/structures 209, contact 220, first hard mask regions 214, second isolation layer 236, second MLG layer 238, and second hard mask layer 234. Silicon substrate 202, circuits layer 204, and isolation layer 206 are relatively unchanged through this processing due to the low temperature (less than about 400, usually less than about 350° C.) processing to form the MLG. Processing temperatures must stay below preferably about 350° C. so to not disturb/perturb at least transistor dopant profiles, contact reliability, via reliability, and low-k dielectric stability (if any). Processing details for carbon residue removal and nickel removal without harming the MLG can be found in at least U.S. Provisional Patent Application No. 63/123,587, filed on 10 Dec. 2020; and International PCT PCT/US21/61361 filed on 1 Dec. 2021. As well, see at least patent applications 63/123,587 and PCT/US21/61361 and at least papers J. Jiang, et al., "Intercalation doped multilayer-graphene-nanoribbons for next generation interconnect," *Nano Letters,* 17 (3), pp. 1482-1488, 2017; and J. Jiang, et al., "All-carbon interconnect scheme integrating graphene wires and carbon-nanotube-vias," *IEEE IEDM,* pp. 14.3.1-14.3.4, 2017; and J. Jiang, et al., "CMOS-Compatible Doped-Multilayer-Graphene Interconnects for Next-Generation VLSI," *IEEE IEDM,* pp. 34.5.1-34.5.4, 2018; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices,* vol. 68, No. 4, April 2021, pp. 2063-2091; the entirety of all of the forgoing are incorporated by reference As illustrated in FIG. 2I, ninth intermediate structure 278 is an example cross-sectional drawing of eighth intermediate structure 277 where the structure has been processed to define, etch, and fill vias 240 optionally but preferred using second hard mask 234. Ninth intermediate structure 278 may include silicon substrate 202, circuits layer 204, isolation layer 206, multiplicity of MLG lines/structures 209, contact 220, first hard mask regions 214, second isolation layer 236, second MLG layer 238, second hard mask layer 234, and vias 240. Ninth intermediate structure 278 has been processed to lithographically form via openings in a photoresist (not shown), then etched to open the second hard mask 234 material in all the desired via 240 desired locations. Then the photoresist may be stripped and wafer/substrate cleaned, and a deep etch may be performed to form the vias 240 where the etch may sequentially, and sometimes selectively, remove portions/regions of the thin second MLG layer 238, then portions/regions of second isolation layer 236 and hard mask 240 and then through multiplicity of MLG lines/structures 209, preferably completely through the MLG material to maximize sidewall contact area between vias 240 and multiplicity of MLG lines/structures 209. Hard mask 234 material may include for example, material such as SiN, $Si_3N_4$, Si rich oxides, and so on, which would be chosen with due engineering care to be selectively etchable to, at least with respect to second MLG layer 238, second isolation layer 236, first hard mask regions 214, and multiplicity of MLG lines/structures 209. Vias 240 may be processed with the desired surface cleaning (if any), then barrier metal(s) deposition(s) and fill of vias 240. The majority volume of vias 240 may be, for example, conductive and EM resistant metals such as Co, Ti, Ta, W, CNT (carbon nano-tubes), and so on. Prior to filling the etched open vias 240, an intercalation doping through the vias 240 holes formed may be performed, depending on engineering considerations. Details of intercalation doping may be found in U.S. Provisional Patent Application 63/441,766 and in J. Jiang, et al., "Intercalation doped multilayer-graphene-nanoribbons for next generation interconnect," *Nano Letters,* 17 (3), pp. 1482-1488, 2017. The top of vias 240 may be CMP'd and use the second hard mask 234 as a polish stop, especially since the multiplicity of second MLG lines/structures 238 has not been defined and etched yet in this process flow.

As illustrated in FIG. 2J, tenth intermediate structure 279 is an example cross-sectional drawing of ninth intermediate structure 278 where the thin second MLG layer 238 may then be lithographically defined in photoresist (not shown) and then etched to form multiplicity of second MLG lines/structures 239. Tenth intermediate structure 279 may include silicon substrate 202, circuits layer 204, isolation layer 206, multiplicity of first MLG lines/structures 209, contact 220, first hard mask regions 214, second isolation layer 236 (sometime referred to in the industry as 'IMD'=Inter-Metal Dielectric), multiplicity of second MLG lines/structures 239, second hard mask layer 234, and vias 240.

An alternative process flow option is to etch the MLG layer 238 to form multiplicity of MLG lines/structures 239 before forming and filling vias 240. This flow, however, may be lithographically more challenging and be more sensitive to forming metal stringers between multiplicity of second MLG lines/structures 239.

An alternative process flow option is to etch the second MLG layer 238 to form a multiplicity of second MLG lines/structures 209 before forming and filling vias 240. This flow, however, may be lithographically more challenging and be more sensitive to forming metal stringers between multiplicity of second MLG lines/structures 239.

The above process flows may be replicated to form as many MLG interconnect layers as required or desired within a device's BEOL. The processing steps of the MLG synthesis are kept below the time/temperature stress levels which might harm the underlying materials/interconnects and devices. This MLG processing may be utilized on a single or many of the device's BEOL layers, as judged due to at least process, device, and design engineering considerations.

Due to the ultra-defect-free directional atomic structure of MLG, effective and low R electrical contact to MLG may best be made from the side of the MLG, rather than the top or bottom of an MLG thin film structure. MLG doping at that edge surface is important. As well, maximal contact edge area is crucial. Thus, techniques to guarantee maximal edge overlap of an MLG line/structure over a contact edge or via edge is important. As illustrated in FIG. 3A, typical MLG line structure 302 overlaps the edge of exemplary contact or via 396 by the value of MLG overlap 308. This can be designed in on the device database such that the masked and etched MLG line/structure has an overlap of the edges of contact or via 306. This may be designed in at least two ways. First is MLG line/structure 302 which includes the width of contact or via 306 plus overlap 308. An alternative construct is illustrated in FIG. 3B. In this case the line 312 width is equal to or smaller that the sum. Resulting in an MLG line/structure width of 310 except for a 'bulge' overlap of overlap 308 whenever a contact or via 316 appears. For both methods/structures, the overlap may be designed whether a via is positioned below or above that specific MLG line/structure level. Thus, a final structure overlap is guaranteed and a minimal contact or via resistance is obtained reliably.

Another technique to maximize the sidewall area of the MLG line/structure in direct contact with the via or contact material is to intentionally serrate or 'roughen' to make a via/contact structure which maximizes the contact or via edge perimeter in the contact/via image formed in the hard mask and/or photoresist, which when etched, will maximize the MLG edge which is in direct contact with the via/contact material. For example, as illustrated in FIG. 4A, a conventional/normal via or contact when properly imaged, would create close to a circle with an associated circle perimeter 401 in the resist image, which would be transferred reasonably closely to a circle on the hard mask material, which then would form a cylinder of exposed MLG sidewall when the hard mask image is etched into the MGL line/structure 402. MLG line/structure 402 includes the width/diameter 405 of contact or via 406 plus overlap 408. The linewidth 404 of MLG line/structure 402 includes the width/diameter 405 of contact or via 406 plus twice the overlap 408. To generally 'guarantee' that the edges of contact or via 406 is covered by the MLG line/structure 402, which yields a repeatable minimum contact or via resistance value, then the width 404 of MLG line/structure 402 (405+2 times 408) must be greater than the width/diameter 405 of contact or via 406. The size/value of the overlap 408 is a complex calculation and determination of process variations; for example, such as the 1 or 2 sigma line to via misalignment value, which may be direct or indirect, the loss or gain of critical dimension of the width 404 of MLG line/structure 402 and/or the via diameter as etched on the device, line edge roughness, mask to resist shift and variations, and so on.

For conventional via and contact resistance control and enabling the lowest possible connection resistance values, control of variation and maximizing the value of the area of the via or contact structure which contacts the line structure is the driver and most critical element. However, for obtaining the lowest resistance values and control resistance variations of connection to a 2-D layered material, such as MLG as an example, the area of the 2-D material sidewall to the via/contact metal is the driver and most critical element. There are various methods and structures in which a via or contact structure could be formed to maximize the topside view perimeter, which would result in a maximal sidewall contact area of the 2-D line/structure material to the via/contact material. The via or contact image on the mask (or direct write raster manipulation) could be formed (with OPC, etc.) to image using the lithography machine of choice, a maximal perimeter via or contact structure, for example, such as the 'star' pattern illustrated in FIG. 4B, notched structure in FIG. 4C and the tooth structure of FIGS. 5A and 5B. This exemplary maximal perimeter pattern could, when properly imaged, would create close to a 'star-like' maximal perimeter shape in the resist image, which would be transferred reasonably closely to the hard mask material, which then would form a serrated maximal surface edge area of contact of exposed MLG sidewall when the hard mask image is etched into the MGL line/structure. Note: this maximal perimeter concept is completely different than the industry has been using up to now, as the industry tried many ways to maximize the bottom contact/via area to obtain the lowest and most consistent contact or via resistance values. This is the result of needing to directly contact the edge of 2-D material, where the electronic band structure is more conducive to forming an effective connection. As well, a conventional via/contact structure attempts to not etch through the line structure thickness; wherein for these novel 2-D material via/contacts one wants to maximize the sidewall connection area, and hence, etching through the line is desirable.

As illustrated in FIG. 4B, MLG line/structure 412 may include via/contact 416 which may have increased topside perimeter 411. The structure may also include MLG line/structure 412 linewidth 414 and MLG line/structure 412 overlap of via 418.

As illustrated in FIG. 4C, MLG line/structure 422 may include via/contact 426 which may have increased topside perimeter 421. The structure may also include MLG line/structure 422 linewidth 424 and MLG line/structure 422 overlap of via 428.

Figure 5A:
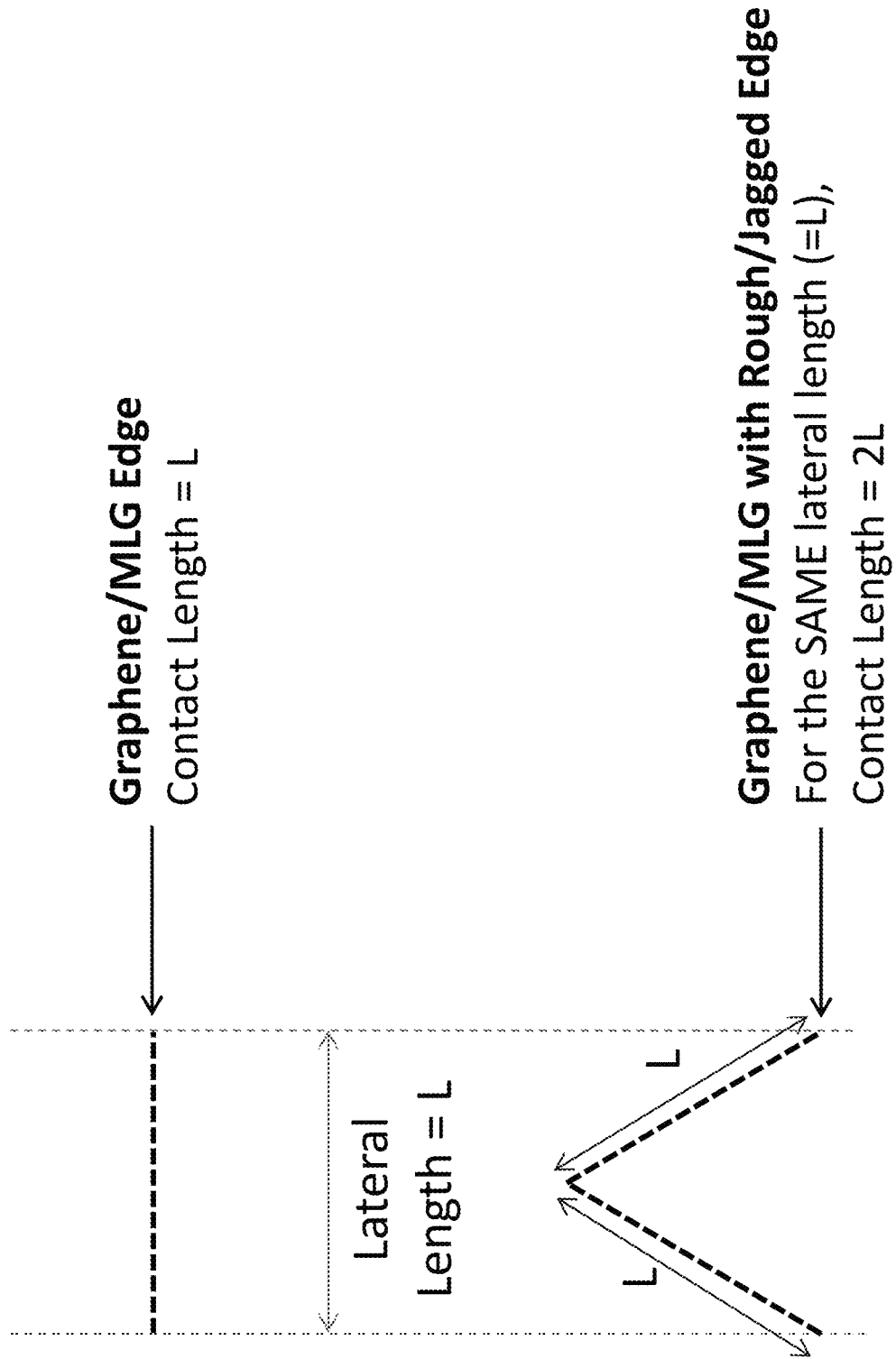
FIG. 5A illustrates an example generalized exemplary description of how a serrated edge via or contact increases the topside perimeter and thus an increased interconnect line to contact/via sidewall contact area.

FIG. 5A illustrates a generalized exemplary description of how a serrated edge via or contact would increase the edge surface connection area between the 2-D line material (for example the MLG line) and the via/contact metal and metal-like (such as silicides, alloys, etc.) material. For the same lateral length L, the improved contact/via could have 2 L length (and thus a greatly increased MLG and contact/via sidewall contact area) and thus improve the absolute value and variation of values for the contact or via resistance. This concept can be applied to various Graphene/MLG edge shapes including circular, square, rectangular, triangular, etc.

Figure 5B:
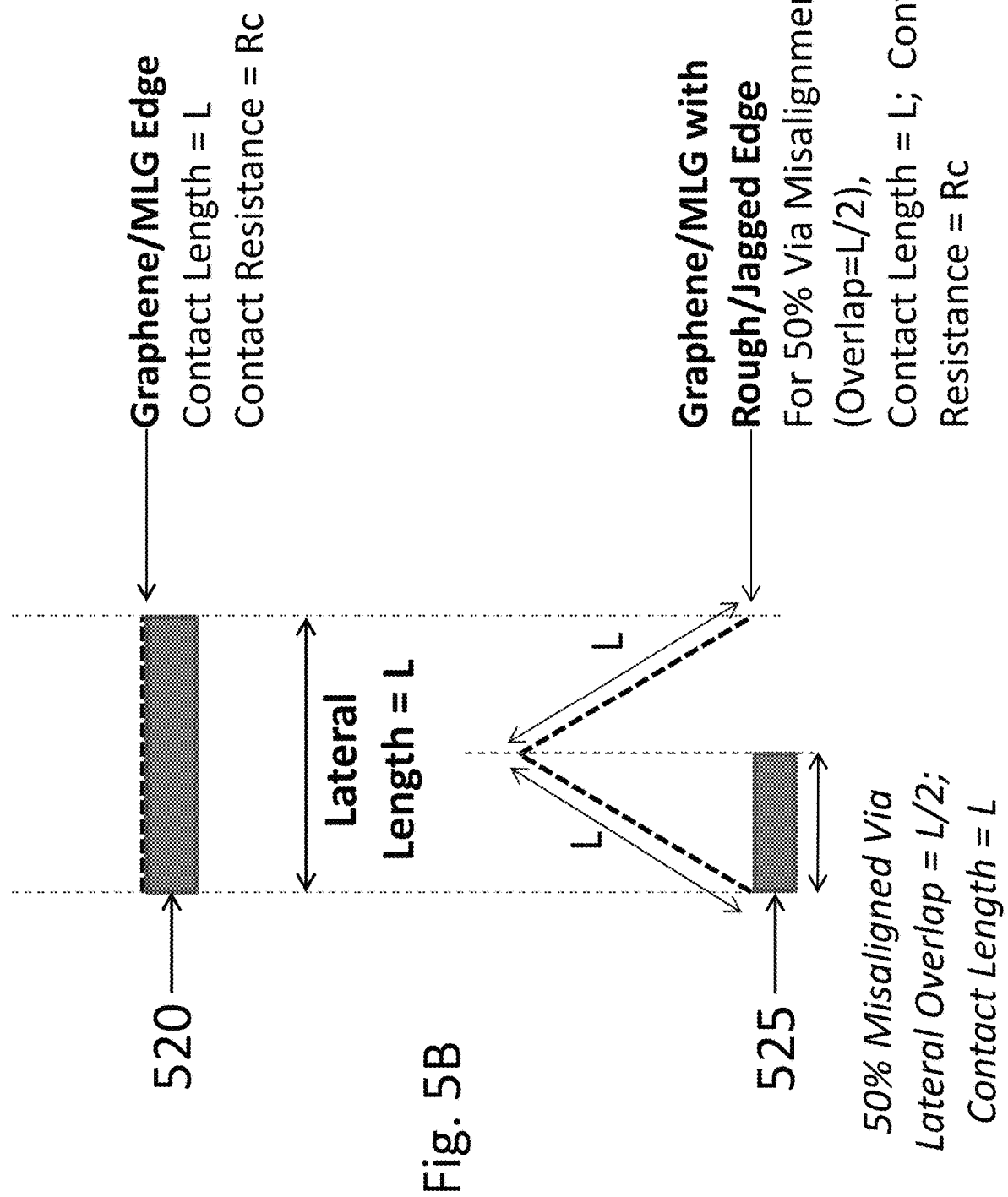
FIG. 5B illustrates an example generalized exemplary description of how a serrated edge via or contact increases the topside perimeter and thus an increased interconnect line to contact/via sidewall contact area which can lower the impact of misalignment of the contact/via.

FIG. 5B illustrates a generalized exemplary description of how increased contact/via perimeter and the edge-only contacting to 2-D materials, especially layered 2-D structures, the rough/jagged or serrated MLG edges for example, can lower the impact of misalignment of the contact/via. This can be a very important improvement upon the conventional misalignment sensitivities of contacts and vias. Foe example, a perfectly aligned via metal 520 would have a contact/via edge of L, giving a contact resistance of Rc. Now let's 'cause' a 50% misalignment of the contact/via 525, so that the lateral overlap is L/2. The contact perimeter length is still L with the 'jagged/rough or serrated edged contact/via shape, thus still yielding a contact resistance of Rc. This concept can be applied to various Graphene/MLG edge shapes including circular, square, rectangular, triangular, etc. to varying degrees of alignment conservation, as well to various other 2-D materials.

MLG line/structure may include many 2-D materials and is not limited to graphene or multiple layered 'line' structures.

CONCLUSION

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

We claim:

1. An interconnection structure, the structure comprising:
    a first BEOL (Back-End-Of-Line) level;
    a first MLG (Multi-Layer Graphene) layer;
    a first isolation layer,
        wherein said first BEOL level comprises said first MLG layer and said first isolation layer,
        wherein said first MLG layer comprises at least one first line structure of MLG material,
        wherein said first isolation layer comprises an electrically isolating material,
        wherein said first isolation layer is disposed above and beside said at least one first line structure of MLG material;
    a second BEOL level;
    a second MLG layer;
    a connection path;
    at least one via,
        wherein said second BEOL level comprises said second MLG layer,
        wherein said second MLG layer is disposed above said first isolation layer, wherein said second MLG layer comprises MLG material,
wherein said connection path electrically connects said first MLG layer to said second MLG layer,
wherein said connection path comprises one of said at least one via,
wherein a width of said at least one first line structure of MLG material is greater than a diameter of said one of said at least one via, and
wherein said first MLG layer and said second MLG layer are intercalation doped (n-type or p-type); and
a second isolation layer disposed below said at least one first line structure of MLG material,
wherein said at least one via is partially etched into said second isolation layer.

2. The interconnection structure according to claim 1, wherein said first MLG layer comprises at least 1 graphene layer.

3. The interconnection structure according to claim 1, further comprising:
a hard mask,
wherein said hard mask is disposed above said second MLG layer.

4. The interconnection structure according to claim 1, wherein said electrically isolating material comprises a low-k dielectric or air-gap or a combination of said air-gap and said low-k dielectric.

5. An interconnection structure, the structure comprising:
a first BEOL (Back-End-Of-Line) level;
a first MLG (Multi-Layer Graphene) layer;
a first isolation layer,
wherein said first BEOL level comprises said first MLG layer and said first isolation layer,
wherein said first MLG layer comprises at least one first line structure of MLG material,
wherein said first isolation layer comprises an electrically isolating material,
wherein said first isolation layer is disposed above and beside said at least one first line structure of MLG material;
a second BEOL level;
a second MLG layer;
a connection path; and
at least one via,
wherein said second BEOL level comprises said second MLG layer,
wherein said second MLG layer is disposed above said first isolation layer,
wherein said second MLG layer comprises MLG material,
wherein said connection path electrically connects said first MLG layer to said second MLG layer,
wherein said connection path comprises one of said at least one via,
wherein a width of said at least one first line structure of MLG material is greater than a diameter of said one of said at least one via, and
wherein said first MLG layer and said second MLG layer are intercalation doped (n-type or p-type),
wherein said at least one via has a topside view serrated pattern first perimeter greater than a second perimeter of a conventional circle-shaped via of equivalent diameter as said at least one via, thus maximizing a sidewall area of said at least one first line structure of MLG material directly contacting said at least one via.

6. The interconnection structure according to claim 5, wherein said first MLG layer comprises at least 1 graphene layer.

7. The interconnection structure according to claim 5, further comprising:
a hard mask,
wherein said hard mask is disposed above said second MLG layer.

8. An interconnection structure, the structure comprising:
a first BEOL (Back-End-Of-Line) level;
a first MLG (Multi-Layer Graphene) layer;
a first isolation layer,
wherein said first BEOL level comprises said first MLG layer and said first isolation layer,
wherein said first MLG layer comprises at least one first line structure of MLG material,
wherein said first isolation layer comprises an electrically isolating material,
wherein said first isolation layer is disposed above and beside said at least one first line structure of MLG material;
a second BEOL level;
a second MLG layer;
a connection path;
at least one via,
wherein said second BEOL level comprises said second MLG layer,
wherein said second MLG layer is disposed above said first isolation layer,
wherein said second MLG layer comprises MLG material,
wherein said connection path electrically connects said first MLG layer to said second MLG layer,
wherein said connection path comprises one of said at least one via,
wherein said second MLG layer comprises at least one second line structure of MLG material,
wherein a width of said at least one second line structure of MLG material is greater than a diameter of said one of said at least one via, and
wherein said first MLG layer and said second MLG layer are intercalation doped (n-type or p-type); and
a second isolation layer disposed below said at least one first line structure of MLG material,
wherein said at least one via is partially etched into said second isolation layer.

9. The interconnection structure according to claim 8, wherein said first MLG layer comprises at least 1 graphene layer.

10. The interconnection structure according to claim 8, further comprising:
a hard mask,
wherein said hard mask is disposed above said second MLG layer.

11. An interconnection structure, the structure comprising:
a first BEOL (Back-End-Of-Line) level;
a first MLG (Multi-Layer Graphene) layer;
a first isolation layer,
wherein said first BEOL level comprises said first MLG layer and said first isolation layer,
wherein said first MLG layer comprises at least one first line structure of MLG material,
wherein said first isolation layer comprises an electrically isolating material,
wherein said first isolation layer is disposed above and beside said at least one first line structure of MLG material;

a second BEOL level;
a second MLG layer;
a connection path; and
at least one via,
   wherein said second BEOL level comprises said second MLG layer,
   wherein said second MLG layer is disposed above said first isolation layer,
   wherein said second MLG layer comprises MLG material,
   wherein said connection path electrically connects said first MLG layer to said second MLG layer,
   wherein said connection path comprises one of said at least one via,
   wherein said second MLG layer comprises at least one second line structure of MLG material,
   wherein a width of said at least one second line structure of MLG material is greater than a diameter of said one of said at least one via, and
   wherein said first MLG layer and said second MLG layer are intercalation doped (n-type or p-type),
   wherein said at least one via has a topside view serrated pattern first perimeter greater than a second perimeter of a conventional circle-shaped via of equivalent diameter as said at least one via, thus maximizing a sidewall area of said at least one first line structure of MLG material directly contacting said at least one via.

12. The interconnection structure according to claim 11, wherein said first MLG layer comprises at least 1 graphene layer.

13. The interconnection structure according to claim 11, further comprising:
a hard mask,
   wherein said hard mask is disposed above said second MLG layer.

14. An interconnection structure, the structure comprising:
a first BEOL (Back-End-Of-Line) level;
a conventional conductor layer;
a first isolation layer,
   wherein said first BEOL level comprises said conventional conductor layer and said first isolation layer,
   wherein said conventional conductor layer comprises at least one first line structure of conventional conductor material,
   wherein said conventional conductor material comprises metals and metal alloys comprising Al, AlCu, Cu, TiN, Ti, TaN, Ta, W, carbon nanotubes, and metal silicides such as $CoSi_2$, $TiSi_2$, $NiSi_2$ and $WSi_2$;
   wherein said first isolation layer comprises an electrically isolating material,
   wherein said first isolation layer is disposed above and beside said at least one first line structure of conventional conductor material;
a second BEOL level;
a first MLG layer;
a connection path; and
at least one via,
   wherein said second BEOL level comprises said first MLG layer,
   wherein said first MLG layer is disposed above said first isolation layer,
   wherein said first MLG layer comprises MLG material,
   wherein said first MLG layer comprises at least one first line structure of MLG material,
   wherein said connection path electrically connects said conventional conductor layer to said first MLG layer,
   wherein said connection path comprises one of said at least one via,
   wherein a width of said at least one first line structure of MLG material is greater than a diameter of said one of said at least one via,
   wherein said connection path electrically connects said first MLG layer to said one of said at least one via with a minimum contact resistance,
   wherein said first MLG layer is intercalation doped (n-type or p-type), and
   wherein said at least one via is partially etched into said at least one first line structure of conventional conductor material.

15. The interconnection structure according to claim 14, wherein said first MLG layer comprises at least 1 graphene layer.

16. The interconnection structure according to claim 14, further comprising:
a hard mask,
   wherein said hard mask is disposed above said first MLG layer.

17. An interconnection structure, the structure comprising:
a first BEOL (Back-End-Of-Line) level;
a conventional conductor layer;
a first isolation layer,
   wherein said first BEOL level comprises said conventional conductor layer and said first isolation layer,
   wherein said conventional conductor layer comprises at least one first line structure of conventional conductor material,
   wherein said conventional conductor material comprises metals and metal alloys comprising Al, AlCu, Cu, TiN, Ti, TaN, Ta, W, carbon nanotubes, and metal silicides such as $CoSi_2$, $TiSi_2$, $NiSi_2$ and $WSi_2$;
   wherein said first isolation layer comprises an electrically isolating material,
   wherein said first isolation layer is disposed above and beside said at least one first line structure of conventional conductor material;
a second BEOL level;
a first MLG layer;
a connection path; and
at least one via,
   wherein said second BEOL level comprises said first MLG layer,
   wherein said first MLG layer is disposed above said first isolation layer,
   wherein said first MLG layer comprises MLG material,
   wherein said first MLG layer comprises at least one first line structure of MLG material,
   wherein said connection path electrically connects said conventional conductor layer to said first MLG layer,
   wherein said connection path comprises one of said at least one via,
   wherein a width of said at least one first line structure of MLG material is greater than a diameter of said one of said at least one via,
   wherein said connection path electrically connects said first MLG layer to said one of said at least one via with a minimum contact resistance,
   wherein said first MLG layer is intercalation doped (n-type or p-type), and
   wherein said at least one via has a topside view serrated pattern first perimeter greater than a second perimeter of a conventional circle-shaped via of equivalent diameter as said at least one via, thus maximizing a sidewall area of said at least one first line structure of MLG material directly contacting said at least one via.

18. The interconnection structure according to claim 17, wherein said first MLG layer comprises at least 1 graphene layer.

19. The interconnection structure according to claim 17, further comprising:
   a hard mask,
      wherein said hard mask is disposed above said first MLG layer.

20. The interconnection structure according to claim 17, wherein said electrically isolating material comprises a low-k dielectric or air-gap or a combination of said air-gap and said low-k dielectric.

* * * * *